Oct. 8, 1957 J. D. LAWRENCE, JR 2,809,302

BI-DIRECTIONAL PARALLEL MAGNETIC AMPLIFIER

Filed March 17, 1955

INVENTOR

JOSEPH D. LAWRENCE, JR

BY

Charles C. English

AGENT

United States Patent Office 2,809,302

Patented Oct. 8, 1957

2,809,302

BI-DIRECTIONAL PARALLEL MAGNETIC AMPLIFIER

Joseph D. Lawrence, Jr., Philadelphia, Pa., assignor, by mesne assignments, to Sperry Rand Corporation, New York, N. Y., a corporation of Delaware Application March 17, 1955, Serial No. 494,846

24 Claims. (Cl. 307—88)

The present invention relates to improved magnetic amplifier structures and is more particularly concerned with an amplifier device capable of selectively effecting current flow through a load impedance in either of two directions.

Magnetic amplifiers comprise a basic component for use in many forms of control and computing apparatuses. It is often desired, when employing such an amplifier device, to selectively pass current through a load impedance in opposite directions in dependence upon a particular circuit condition, or upon a desired output effect. In the past, when such operation has been desired, it has been the practice to utilize plural magnetic amplifiers coupled to the load impedance in question whereby the foregoing variation in direction of current flow has been effected by selective control of the separate magnetic amplifiers utilized. The arrangement thus described has been accompanied by the disadvantages that, by requiring that plural amplifiers be employed, the resulting system has been relatively costly and further, has utilized a relatively large number of components, making the over-all system somewhat cumbersome and more subject to operating failures. The present invention serves to obviate the foregoing difficulties and provides a novel magnetic amplifier configuration whereby a single amplifier may be employed for selectively effecting bi-directional current flow through a load impedance. The use of the bi-directional amplifier thus reduces the number of inputs (i. e. set windings) over those required in a system using pairs of conventional uni-directional amplifiers to obtain bi-directional load currents.

It is accordingly an object of the present invention to provide a novel magnetic amplifier.

A further object of the present invention resides in the provision of a parallel magnetic amplifier capable of effecting bi-directional current flow through a load impedance.

Another object of the present invention resides in the provision of a magnetic amplifier control system for effecting bi-directional current flow which is less expensive and less subject to operating failures than has been the case heretofore.

A still further object of the present invention resides in the provision of a magnetic amplifier control system for effecting bi-directional flow through a load impedance, which system may assume a smaller size than has been the case heretofore.

In accomplishing the foregoing objects and advantages, the present invention utilizes a magnetic amplifier preferably of the parallel type, comprising a core of magnetic material having an output winding thereon. The invention is more specifically directed to a novel arrangement of the said output winding in combination with a load impedance and gate pulse sources; and in this respect the advantages of the present invention are achieved by center-tapping the said output winding, coupling the load impedance to this center tap at one of its ends and coupling the opposing ends of the output winding to the said load impedance via gate pulse sources. By employing this arrangement, control signals may be utilized to render one or the other of the said gate pulse sources conductive, whereby potentials generated in the output winding of the said amplifier, due to normal operation of the said amplifier, will selectively cause current flow through the said load impedance in one or the other direction, in dependence upon which of the gate pulse sources is so controlled. By utilizing this arrangement, therefore, only a single amplifier need be employed for effecting bi-directional current flow through a given load impedance, thus achieving the desired bi-directional operation in a much more simple and inexpensive structure than has been possible heretofore.

The foregoing objects, advantages, construction and operation of my invention will become more readily apparent from the following description and accompanying drawings, in which.

Figures 1, 2, 3, 4:
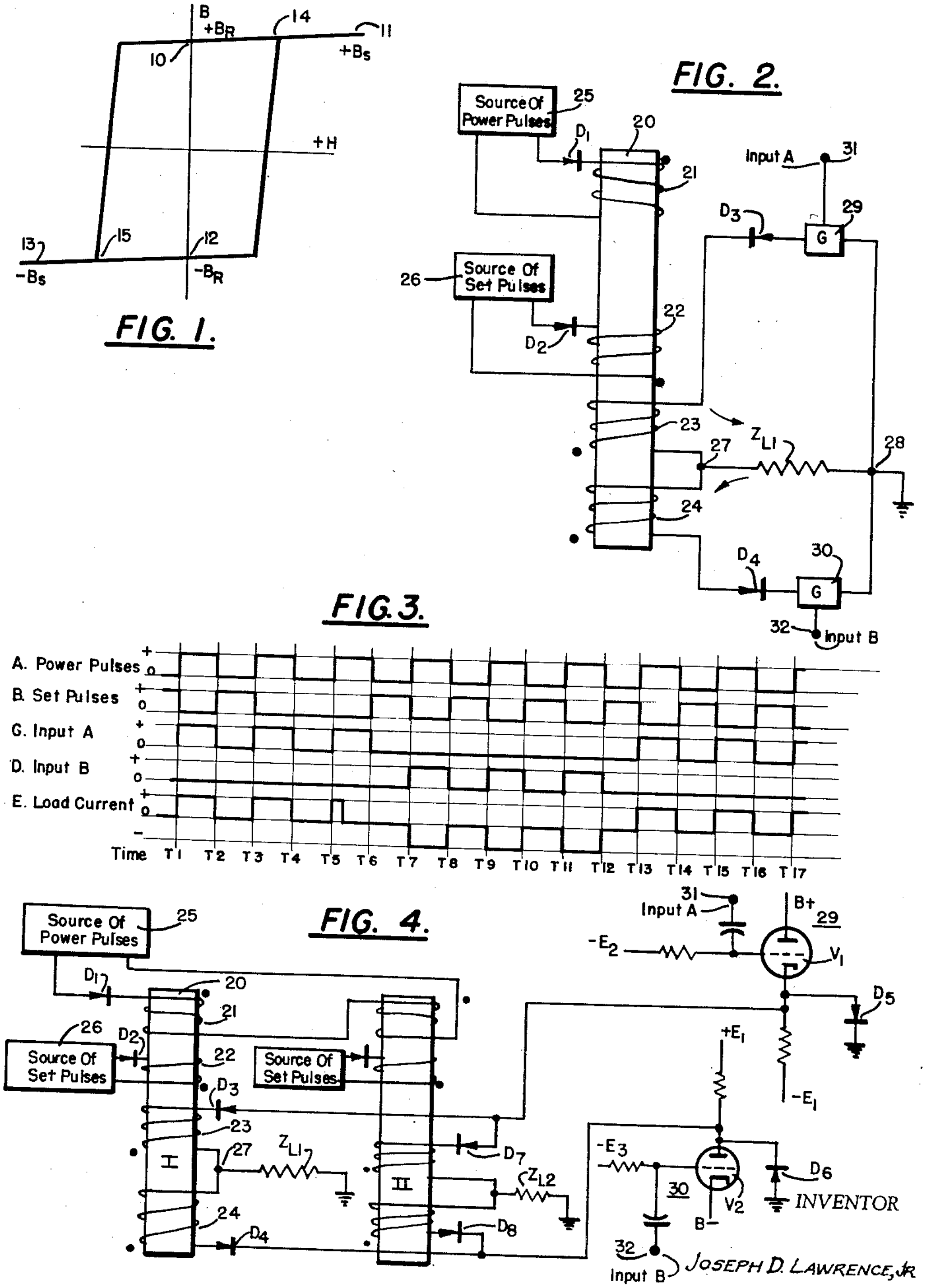
Figure 1 is an idealized hysteresis loop of a magnetic material which may preferably, but not necessarily, be employed in the magnetic core of my amplifier.
Figure 2 is a schematic representation of a magnetic amplifier interconnected with a load impedance and gate pulse sources in accordance with the present invention.
Figure 3 (A through E), are waveform diagrams illustrating the operation of the circuit shown in Figure 2.
Figure 4 is a schematic diagram of a system employing plural amplifiers in accordance with the present invention.

Referring now to the hysteresis loop shown in Figure 1, it will be seen that magnetic amplifiers constructed in accordance with the present invention may preferably, but not necessarily, utilize magnetic cores exhibiting a substantially rectangular hysteresis loop. Such cores may be made of a variety of materials, among which are the various types of ferrites and various kinds of magnetic tapes, including Orthonik and 4–79 Molypermalloy. These materials may in turn be given different heat treatments to effect different desired properties. In addition to the wide variety of materials applicable, the cores of the magnetic amplifiers to be discussed may be constructed in a number of different geometries, including both closed and open paths. For example, cup-shaped cores, strips of material, or toroidal cores may be utilized. It must be emphasized, however, that the present invention is not limited to any specific geometries of its cores nor to any specific hysteretic configuration therefor, and the examples to be given are illustrative only.

Returning now to the hysteresis loop shown in Figure 1, it will be noted that the curve exhibits several significant points of operation, namely, point 10 ($+B_r$) which represents a point of plus remanence; the point 11 ($+B_s$) which represents plus saturation; the point 12 ($-B_r$) which represents minus remanence; the point 13 ($-B_s$) which represents minus saturation; the point 14 which represents the beginning of the plus saturation region; and the point 15 which represents the beginning of the minus saturation region.

Discussing for the moment the operation of a device utilizing a core which exhibits a hysteresis loop such as has been shown in Figure 1, let us initially assume that first and second coils are wound on the said core. If the core should now initially be at its operating point 10 (plus remanence), and if a voltage should be applied to the said first coil, causing a current flow through the said first coil which effects a magnetomotive force in a direction of $+H$, the said core will tend to be driven from its plus remanence operating point 10 to its plus saturation operating point 11. During this state of operation a relatively small voltage will be induced in the said second coil.

If on the other hand the core should initially be at its minus remanence operating point 12, and a current is caused to flow through the said first winding, once more to subject the said core to a +H magnetizing force, the core will be caused to move from its said operating point 12 to the region of plus saturation, preferably to the operating point 14, and a relatively large flux change will therefore be effected through the said core whereby a relatively large voltage will be induced in the said second winding. Thus, depending upon whether the said core is initially at its plus remanence point or at its minus remanence point, the application of a +H magnetizing force to the said core will effect either a relatively small or a relatively large output across a winding carried by the said core. The foregoing considerations are employed in so-called parallel type magnetic amplifiers, and it is with this type of amplifier that the present invention is primarily concerned.

Referring now to the schematic diagram of Figure 2, it will be seen that a magnetic amplifier constructed in accordance with the present invention may comprise a core 20 of magnetic material preferably, but not necessarily, exhibiting a hysteresis loop of the type shown in Figure 1. The said core 20 may carry a power winding 21 and a set winding 22 thereon; and may further carry output windings 23 and 24 (which may comprise two interconnected windings as shown, or a single center-tapped winding) inductively coupled to the said power and set windings. A source of power pulses 25, of the configuration shown in Figure 3A, is preferably coupled via a rectifier D1 to the power winding 21 and a further source of set pulses 26, of the configuration shown in Figure 3B, may be coupled via a rectifier D2 to the said set winding 22.

As will be seen from an examination of Figure 3, the power pulses are regularly occurring and they should preferably be of sufficient magnitude to drive the core 20 from its minus remanence operating point 12 to its plus remanence operating point 10, preferably via the operating point 14. Similarly, the set pulses are regularly occurring and occur between the said power pulses, these set pulses also being of sufficient magnitude to drive the said core 20 from one of its remanence points to the other thereof.

In the particular example shown in Figures 2 and 3, the power pulses and set pulses are each positive-going in polarity, and inasmuch as the power winding 21 and set winding 22 are wound opposite to one another on the core 20, the magnetizing effect of the said power pulses and set pulses upon the said core 20 will be opposite in effect. It must be understood, however, that the winding 22 may be reversely placed upon the core 20 and the polarity of the set pulses would then be changed accordingly; and in accordance with known techniques, one of the two windings 21 or 22 may be eliminated and set pulses may be alternately coupled, by appropriate circuitry, to a single control winding carried by the core 20. Another alternative is to use several set windings, any one of which will set the core. This arrangement provides the amplifier with several inputs, and the amplifier functions as an "or" circuit. Other well known arrangements of set windings may be employed so that the amplifier will function as an "and" circuit, or so that it will have inhibit and enable windings.

The output windings 23 and 24 are coupled together at a point 27 which may be considered to represent a center-tap, and a load impedance $Z_{L_1}$ is coupled at one of its ends to the said center-tap 27 and at the other of its ends to a point of ground potential 28. The upper end of winding 23 is coupled via a rectifier D3 and a gate pulse source 29 to the said point 28, and similarly the lower end of output winding 24 is coupled via a further rectifier D4 and a further gate pulse source 30 to the said ground point 28. In some applications it may be desirable to place rectifiers D3 and D4 between point 27 and windings 23 and 24 respectively. Gate pulse sources 29 and 30 may take the form of any well known permissive or inhibition type electronic gate known in the art. The gate pulse source 29 is also coupled to a terminal 31 supplied with a source of control pulses, termed input A, and the gate pulse source 30 is similarly coupled to a further terminal 32 supplied with a further source of control pulses, termed input B. The polarity of pulses applied at the terminals 31 and 32 will be dependent upon whether the gate pulse sources 29 and 30 are of the permissive or inhibition type, but it should be noted that the input A and input B pulses shown are preferably synchronized with one another and have opposing effect upon their respective gates whereby one only of the gate pulse sources 29 or 30 is rendered conductive at a given time. By this arrangement therefore one gate pulse source is caused to render its corresponding portion of the secondary circuit effectively non-conductive, while the other gate pulse source offers relatively low impedance to the passage of current. By selecting which of the gate pulse sources is therefore in a conductive state, the direction of current flow through the load impedance $Z_{L_1}$ will be also controlled. It should be noted that, in a system comprising a plurality of bi-directional amplifiers, it may not be necessary for each amplifier to have a separate pair of gates. Several amplifiers may share the same pair of gates, and such an embodiment of the present invention is shown, for instance, in Figure 4.

Referring now to the waveforms shown in Figure 3, let us assume that the core 20 is initially at its minus remanence operating point 12, and that the input A and input B pulses applied respectively to terminals 31 and 32 are as shown in Figures 3C and 3D for the time interval *t1* to *t6*. During the time interval *t1* to *t2*, a positive-going power pulse is applied from the source 25 to the power winding 21 via the rectifier D1, thereby subjecting the core 20 to a +H magnetizing force. This magnetizing force drives core 20 from its minus remanence operating point 12 to its plus remanence operating point 10, via the operating point 14, whereby a relatively large voltage is induced in the output windings 23 and 24 during time interval *t1* to *t2*. As may be seen from the polarity markings adjacent each of the windings 21, 23 and 24, the voltages thus induced in the output windings 23 and 24 are of proper polarity to render each of the rectifiers D3 and D4 conductive if greater opposing voltages are not applied by the gates. Inasmuch as a positive-going input A control pulse is fed from the terminal 31 to enable the gate pulse source 29, only the secondary current of the magnetic amplifier is permitted to flow only through the rectifier D3 and current will therefore flow through the load $Z_{L_1}$ from the point 27 to the point 28. This particular direction of current flow has been designated as a positive-going pulse of load current during the time interval *t1* to *t2* (Figure 3E), inasmuch as point 27 will be raised to a positive potential in respect to ground.

During the time interval *t2* to *t3*, the power pulse applied from the source 25 falls to zero volts, and a positive-going set pulse is applied from the source 26 to the set winding 22 via the rectifier D2. Inasmuch as the winding 22 is wound in a direction opposite to that of winding 21, the core 20 will therefore be subjected to a −H magnetizing force during the time interval *t2* to *t3* and the core 20 will therefore be moved from its operating point 10 to its operating point 12, via the operating point 15. The application of such a set pulse will once more induce voltages in the output windings 23 and 24, but inasmuch as these voltages are of a polarity opposite to that effected by flow of current through the power winding 21, the rectifiers D3 and D4 will be effectively cut off and no current will flow through the load impedance $Z_{L_1}$.

During the time interval *t3* to *t4*, a further positive-going power pulse will once more cause current to flow through the load impedance $Z_{L_1}$, again from the point 27 to the point 28, inasmuch as the gate pulse source 29 is rendered conductive by the application of a positive-going input A control pulse to the said gate 29 from terminal 31.

If a set pulse should be omitted, for instance as has been done at time interval $t4$ to $t5$, core 20 will remain at point 10. During time interval $t5$ to $t6$ the power pulse applied to winding 21 will drive core 20 from $+Br$ (point 10) to $+Bs$ (point 11) effecting a much smaller flux change than occurs when a set core is driven from $-Br$ (point 12) to $+Bs$ (point 11). This reduced flux change is reflected in a much shorter pulse of output current during $t5$ to $t6$, for instance, as is shown in Figure 3E for this particular time interval.

If now during the time interval $t7$ to $t8$, an input B pulse should be applied via the terminal 32 to the gate pulse source 30, this gate pulse source 30 will be rendered conductive and the gate pulse source 29 will correspondingly be rendered non-conductive. Voltages induced in the output windings 23 and 24 by the application of a power pulse to the winding 21 during the time interval $t6$ to $t7$ will therefore cause an output current to flow via the rectifier D4 and gate pulse source 30, whereby current will flow through the load impedance $Z_{L_1}$ from the point 28 to the point 27. This second direction of current flow has been represented by a negative-going pulse of load current (Figure 3E) inasmuch as point 27 is now at a negative potential with respect to ground. In the particular waveform configuration selected, it has been assumed that the gate pulse source 29 is rendered conductive for the time intervals $t1$ to $t6$, and $t13$ et seq., while the gate pulse source 30 is rendered conductive for the time interval $t7$ to $t12$ only. This selective control of the two gate pulse sources utilized effects current flow in opposite directions through the load impedance $Z_{L_1}$, as is illustrated in Figure 3E. By the foregoing arrangement, therefore, a single magnetic amplifier operating in conjunction with a pair of pulse responsive gates, may effect bi-directional current flow through the load impedance interconnected with the said gates and an output winding of the said magnetic amplifier.

As has been mentioned previously, the concepts of the present invention may be employed in systems utilizing a plurality of bi-directional amplifiers; and in such a system, even further economy is achieved by employing a single pair of gate pulse sources for such a plurality of amplifiers. Thus, referring to Figure 4, it will be seen that, in accordance with a further embodiment of the present invention, two amplifiers I and II may be employed, it being understood that, by eliminating amplifier II, Figure 4 is illustrative of one form of gating arrangement in accordance with the logic of Figure 2 and that on the other hand, even more than two amplifiers may be so utilized. Amplifier I corresponds to the arrangement shown in Figure 2 and includes the core 20, the windings 21 through 24 inclusive, the source of power pulses 25, the source of set pulses 26, the load impedance $Z_{L_1}$, and the rectifiers D3 and D4. Amplifier II is directly analogous to that discussed in Figure 2 and includes the rectifiers D7 and D8, connected as shown, and a load impedance $Z_{L_2}$.

The gate pulse sources 29 and 30 include respectively the vacuum tubes V1 and V2 and their associated components. Clearly, other types of gates may be employed, provided they perform the necessary functions set forth hereinbefore. In the particular device of Figure 4, however, the gate 29 is so arranged that a voltage source $-E_2$ cuts off the vacuum tube V1 when there is no input at the input A terminal 31. Thus, the cathode of V1 is at $-E_1$ volts under these operating conditions, this voltage ($-E_1$) being sufficient to prevent conduction through the rectifiers D3 and D7. When a positive signal is applied to the input A terminal 31, V1 conducts, whereby its cathode voltage rises to zero volts, where it is clamped by rectifier D5. With the cathode of V1 at zero volts, rectifiers D3 and D7 can then conduct, if their associated amplifiers are undergoing a flux change.

Gate 30, utilizing the vacuum tube V2, operates in a manner similar to that discussed in reference to gate 29, except that the polarities employed are different. Thus, when vacuum tube V2 is non-conducting, rectifiers D4 and D8 are rendered non-conductive by the voltage $+E_1$. When V2 conducts, due to the application of an input B signal at the terminal 32, however, its plate falls to zero, thereby permitting the rectifiers D4 and D8 to conduct in the manner described previously.

While I have described a preferred embodiment of my invention, many variations will readily suggest themselves to those skilled in the art. In particular, the precise parallel type magnetic amplifier shown is merely illustrative and many variations may be effected therein. Certain of these have already been mentioned in respect to the possible winding configuration and in respect to the interrelationship of set and power pulses which may be employed.

Still further variations may be employed, and in this respect reference is made to the copending application, assigned to the assignee of the instant application, of John Presper Eckert, Jr. and Theodore H. Bonn, Serial No. 382,180, filed September 24, 1953, for: "Signal Translating Device." This particular copending application, for instance, illustrates other forms of parallel magnetic amplifier devices which may be employed in the practice of the present invention.

Having thus described my invention, I claim:

1. A magnetic amplifier comprising a core of magnetic material having first and second windings thereon, means coupling a source of regularly occurring power pulses to said first winding, a load impedance, first gating means coupling one end of said second winding to said load impedance, second gating means coupling the other end of said second winding to said load impedance, said first and second gating means being selectively conductive in opposing directions with respect to said load impedance, and means coupling control signals to said first and second gating means thereby selectively to render conductive one or the other of said gating means whereby current flow may be effected selectively in either one of two opposing directions through said load impedance.

2. The magnetic amplifier of claim 1 wherein said second winding includes a center-tap, said load impedance being coupled at one end to said center-tap and at its other end to the outputs of said first and second gating means.

3. The magnetic amplifier of claim 2 including first rectifier means interposed between said one end of said second winding and said first gating means, and second rectifier means interposed between said other end of said second winding and said second gating means, said first and second rectifier means being oppositely poled with respect to said first and second gating means.

4. The magnetic amplifier of claim 3 wherein said core comprises a magnetic material exhibiting a substantially rectangular hysteresis loop.

5. A magnetic amplifier comprising a core of magnetic material, first means coupled to said core and subjecting said core to a first regularly occurring magnetomotive force in a first direction, second means coupled to said core and subjecting said core to a second magnetomotive force occurring between said first magnetomotive force in a direction opposite to that of said first magnetomotive force, an output winding on said core, said output winding being center-tapped, a load impedance coupled at one of its ends to said center-tap, first control means coupling one end of said output winding to the other end of said load impedance for selectively permitting current flow in a first direction through said load impedance, second control means coupling the other end of said output winding to said other end of said load impedance for selectively permitting current flow in a second direction, opposite to said first direction, through said load impedance, and pulse means coupled to each of said control means for selectively causing one or the other of said control means to pass current from said output winding thereby to control the direction of current flow in said load impedance.

6. The magnetic amplifier of claim 5 wherein each of said first and second control means comprises an electronic gate.

7. The magnetic amplifier of claim 5 wherein said first and second means comprise separate windings carried by said core.

8. The magnetic amplifier of claim 5 wherein said first and second means comprise a coil carried by said core, and means causing current alternately to flow in opposite directions through said coil.

9. The magnetic amplifier of claim 5 wherein each of said first and second control means includes rectifier means, said rectifier means being so poled with respect to said output winding that they are substantially non-conductive during the application of said second magnetomotive force to said core.

10. A magnetic amplifier comprising a core of magnetic material having first, second, and third windings thereon, means coupling a source of regularly occurring power pulses to said first winding, a load impedance, means coupling one end of said second winding to one end of said third winding and to one end of said load impedance, first control means coupling the other end of said second winding to the other end of said load impedance, second control means coupling the other end of said third winding to the said other end of said load impedance, said first and second control means being selectively conductive in opposing direction with respect to said load impedance, and means for rendering one or the other of said control means operative thereby to effect current flow in either preselected one of two opposing directions through said load impedance.

11. The magnetic amplifier of claim 10 wherein said first and second control means include an electronic gate, said last-named means comprising a source of selective control pulses coupled to said gate.

12. The magnetic amplifier of claim 10 wherein each of said first and second control means includes rectifier means, said rectifier means being non-conductive between applications of said regularly occurring power pulses.

13. The magnetic amplifier of claim 10 wherein said core comprises a magnetic material exhibiting a substantially rectangular hysteresis loop.

14. A magnetic amplifier comprising a core of magnetic material, means subjecting said core to a regularly occuring magnetomotive force, an output coil on said core, a load impedance, pulse responsive control means coupling said load impedance to said output coil, said control means including means providing two current paths coupled to said load impedance and selectively conductive in opposing directions with respect to said load impedance, and a source of control pulses coupled to said control means thereby to selectively control the conductivity of said two current paths, whereby current may flow in either selected one of two opposing directions through said load impedance.

15. The magnetic amplifier of claim 14 wherein said control means comprises separate electronic gates respectively coupling opposite ends of said output coil to said load impedance.

16. A bi-directional magnetic amplifier comprising a core of magnetic material having a center-tapped winding thereon, a load impedance coupled at one of its ends to said center-tap, a first gate pulse source coupling one end of said winding to the other end of said load impedance, and a second gate pulse source coupling the other end of said winding to said other end of said load impedance, said first and second gate pulse sources being selectively conductive in opposing directions with respect to said load impedance, and means for controlling the conductivity of said gate pulse sources.

17. A magnetic amplifier comprising a core of magnetic material, first input means coupled to said core and subjecting said core to a first regularly occurring magnetomotive force in a first direction, second input means coupled to said core and subjecting said core to a second magneto-motive force occurring between said first magnetomotive force in a direction opposite to that of said first magnetomotive force when an output is desired, two output windings on said core, a load impedance coupled at one of its ends to a first end of each output winding, first control means coupling the second end of one of said output windings to the other end of said load impedance, second control means coupling the second end of the other output winding to said other end of said load impedance, said first and second control means being selectively conductive in opposing directions with respect to said load impedance, and means coupled to each of said control means for selectively causing one or the other of said control means to pass current from one or the other of said output windings thereby to preselect the direction of current flow through said load impedance.

18. A magnetic amplifier comprising a core of magnetic material having means coupled to said core for subjecting said core to a regularly occurring magnetomotive force, first and second output windings on said core, a load impedance, means coupling one end of said first winding to one end of said second winding and to one end of said load impedance, first signal responsive control means coupling the other end of said first winding to the other end of said load impedance, second signal responsive control means coupling the other end of said second winding to the said other end of said load impedance, said first and second control means being selectively conductive in opposing directions with respect to said load impedance, and signal means for rendering one or the other of said control means operative thereby to control selectively the direction of current flow through said load impedance.

19. The magnetic amplifier of claim 17 wherein each of said first and second control means comprises an electronic gate.

20. The magnetic amplifier of claim 18 wherein each of said first and second control means comprises an electronic gate.

21. In a magnetic device, a core of magnetic material having a coil thereon, means for inducing a potential in said coil, a load impedance, first and second distinct circuits for coupling said load impedance to said coil, said first and second circuits including first and second rectifiers respectively, first and second signal responsive switching means connected in series with said first and second rectifiers respectively, said series connected rectifiers and switching means being selectively conductive in opposing directions with respect to said load respectively, and means for selectively coupling control signals to said first and second switching means to render a preselected one only of said switching means conductive thereby to effect current flow via said load and via a preselected one only of said rectifiers and switching means, whereby the direction of current flowing in said load due to said induced potential in said coil is dependent upon which of said series connected switching means and rectifiers is rendered conductive.

22. In a magnetic device, a core of magnetic material having a center-tapped coil thereon, means for inducing a potential in said coil, a load connected at one of its ends to said center-tap, first signal responsive gating means coupling the other end of said load to one end of said coil for selectively permitting current flow in a first direction through said load, second signal responsive gating means coupling the said other end of said load to the other end of said coil for selectively permitting current flow in a second direction, opposite to said first direction, through said load, and control means coupled to said first and second gating means for opening a preselected one only of said gating means to current flow therethrough.

23. In a magnetic circuit, a core of magnetic material having a center-tapped coil thereon, means for producing a potential in said coil, a load, first circuit means for connecting said load between one end of said coil and the center-tap thereof and comprising a first rectifier and first signal responsive gating means, said first rectifier and first gating means each being connected in series with said load and being selectively conductive to pass current from said coil center-tap via said load to said one end of said coil, second circuit means for connecting said load between the other end of said coil and the center-tap thereof and comprising a second rectifier and second signal responsive gating means, said second rectifier and second gating means each being connected in series with said load and being selectively conductive to pass current from said other end of said coil via said load to said coil center-tap, and control means for controlling the conductivity of said first and second gating means thereby to control the direction of current flow in said load.

24. The combination of claim 23 wherein said load is coupled at one of its ends to said coil center-tap, said first circuit means being connected between the other end of said load and said one end of said coil with the cathode of said first rectifier being coupled to said one end of said coil, said second circuit means being connected between said other end of said load and said other end of said coil with the anode of said second rectifier being coupled to said other end of said coil.

References Cited in the file of this patent

UNITED STATES PATENTS 2,709,225 Pressman ---------------- May 24, 1955